(12) United States Patent
Liu

(10) Patent No.: US 6,181,611 B1
(45) Date of Patent: Jan. 30, 2001

(54) TECHNIQUES OF ISOLATING AND ENABLING HIGHER SPEED ACCESS OF MEMORY CELLS

(75) Inventor: Lin-shih Liu, Fremont, CA (US)

(73) Assignee: Winbond Electronics Corporation (TW)

( * ) Notice: Under 35 U.S.C. 154(b), the term of this patent shall be extended for 0 days.

(21) Appl. No.: 09/399,906

(22) Filed: Sep. 21, 1999

Related U.S. Application Data

(62) Division of application No. 09/085,151, filed on May 27, 1998, now Pat. No. 5,999,459.

(51) Int. Cl.$^7$ .................................................. G11C 7/00
(52) U.S. Cl. .............................. 365/189.06; 365/230.06
(58) Field of Search ......................... 365/189.06, 230.03, 365/230.06, 189.11, 189.09

(56) References Cited

U.S. PATENT DOCUMENTS

| | | | |
|---|---|---|---|
| 4,351,034 | 9/1982 | Eaton, Jr. et al. | 365/189.09 |
| 5,301,160 | 4/1994 | McAdams | 365/226 |
| 5,359,572 | * 10/1994 | Sato et al. | 365/230.06 |
| 5,369,317 | 11/1994 | Casper et al. | 365/189.09 |
| 5,400,279 | * 3/1995 | Momodomi et al. | 365/230.06 |
| 5,682,348 | 10/1997 | Lin et al. | 365/189.11 |
| 5,774,406 | 6/1998 | Kowshik | 365/226 |
| 5,859,797 | 1/1999 | Maccarrone et al. | 365/189.09 |

* cited by examiner

*Primary Examiner*—Vu A. Le
(74) *Attorney, Agent, or Firm*—Townsend and Townsend and Crew LLP

(57) ABSTRACT

A pass gate isolation circuit (140) provides voltages to isolation pass gates (120) to allow higher speed access of rows in the memory array (105). When a read access of the array occurs, the pass gate isolation circuit generates a dynamic high voltage level at its output (315). The output becomes a steady state high voltage determined by a high voltage keeper circuit (320) and a voltage clamp circuit (325). When a write access of the array occurs, the pass gate isolation circuit generates an output level sufficient to permit addressing of the array and isolation of the row decoders (140).

24 Claims, 4 Drawing Sheets

US 6,181,611 B1

TECHNIQUES OF ISOLATING AND ENABLING HIGHER SPEED ACCESS OF MEMORY CELLS

This is a divisional application of U.S. patent application Ser. No. 09/085,151, filed May 27, 1998 now U.S. Pat. No. 5,999,459 which is incorporated by reference.

BACKGROUND OF THE INVENTION

The present invention relates to the field of integrated circuits, and more specifically to high voltage isolation circuitry for a memory integrated circuit.

Memory integrated circuits such as DRAMs, SRAMs, EPROMs, EEPROMs, and Flash memories are used in many applications such as computers, networking, and telecommunications. Consumers continue to demand greater performance in their electronic products. For example, higher speed computers will provide higher speed graphics for multimedia applications or development. Higher speed internet web servers will lead to greater on-line commerce including on-line stock trading, book sales, auctions, and grocery shopping, just to name a few example. Higher performance memory integrated circuits will improve the performance of the products in which they are incorporated.

In particular, the speed of a memory integrated circuit depends on the internal propagation delays of signals within the circuit. An array of memory cells in a memory circuit is typically organized by rows and columns. By providing an address to the row decoders, a row decoder selects a particular row. A speed path propagation delay is determined in part by the time it takes for a decoder to access or drive a particular row. Furthermore, it is important that the voltages selected to interface with the array and other circuitry provides for reliable and proper operation of the integrated circuit.

As can be seen, techniques and circuitry for improving the performance of memory integrated circuits are needed.

SUMMARY OF THE INVENTION

The present invention provides techniques and circuitry for improving the performance of a memory integrated circuit. More specifically, a pass gate isolation circuit of the present invention provides voltages to isolation pass gates (which couple the row decoders to the word lines of a memory array) that allow higher speed access of rows in the memory array.

When a read access of the array occurs, the pass gate isolation circuit generates a dynamic high voltage at its output. Subsequently, the output becomes a steady state high voltage maintained by a high voltage keeper circuit and a voltage clamp circuit.

When a write access of the array occurs, the pass gate isolation circuit generates an output level sufficient to permit addressing of the array and high voltage isolation of the row decoders.

The techniques and circuitry of the present invention allow the design and fabrication of higher performance integrated circuits. Greater reliability and low power consumption are also provided.

In a specific embodiment, the present invention is an integrated circuit including a first transistor connected to an output node; a second transistor connected between the output node and a first supple voltage, where a gate of the second transistor is connected to the first transistor; and a third transistor coupled between the gate of the second transistor and a second supply voltage. Furthermore, a substrate connection of the first transistor and second transistor may be coupled to the output node. A further embodiment of the invention may include a high voltage keeper circuit to provide a high voltage to the output node; and a voltage clamp circuit coupled to clamp a high voltage at the output node.

In another embodiment, the present invention is an integrated circuit memory including an array of memory cells arranged in rows and columns, where the rows of memory cells are associated with a plurality of word lines. There are a plurality of row decoders to drive the plurality of word lines. There are a plurality of isolation pass gate devices connected between the plurality of row decoders and plurality of word lines of the array of memory cells. There is a pass gate isolation circuit to provide voltages to control electrodes of the plurality of isolation pass gate devices. The pass gate isolation circuit dynamically couples to the control electrodes a first high voltage level during a first period of a first operational mode, and provides a second high voltage level during a second period of the first operational mode.

In a further embodiment, the present invention includes a method of operating an integrated circuit including in a first mode, a first voltage level is provided to an isolation device to isolate a high voltage on a word line form being drained by a row decoder coupled to the word line. In a second mode, a second voltage level is dyanmically coupled to the isolation device to permit transfer of a signal the row decoder to the word line. Furthermore, in the second mode, a third voltage level is maintained to the isolation device in a steady state.

Other objects, features, and advantages of the present invention will become apparent upon consideration of the following detailed description and the accompanying drawings, in which like reference designations represent like features throughout the figures.

DESCRIPTION OF THE SPECIFIC EMBODIMENTS

Figure 1:
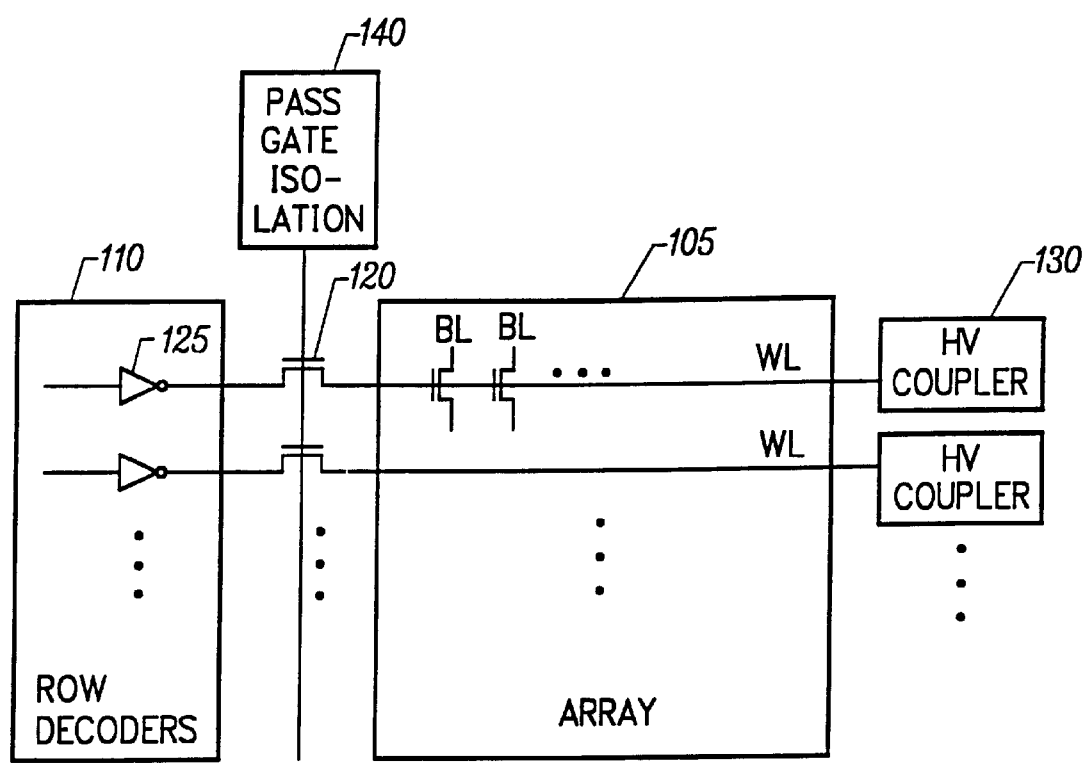
FIG. 1 shows a high-level architectural diagram of components of a memory integrated circuit.

FIG. 1 shows a high-level architectural diagram of components of a memory integrated circuit. This figure does not show all the details of the memory integrated circuit, but shows the components useful for understanding the present invention.

The memory integrated circuit includes an array 105 of memory cells. These memory cells store binary information. For example, each memory cell may store a "1" or a "0" logical value. In alternative embodiments, a single memory cell be used may store more than two logical states; for example, these states may include a "00," "01," "10," or "11."

Memory cells may be formed using transistors (for an SRAM); capacitors (for a DRAM); EPROM, EEPROM, or Flash cells (for a EPROM, EEPROM, or Flash memory, respectively), or one of the many other memory devices used to form memory cells in semiconductor processes. EPROM, EEPROM, and Flash cells are nonvolatile devices, so that the stored data is retained even when power is removed from the integrated circuit.

In a specific embodiment of the invention, the memory cells are floating gate devices such as an EPROM, EEPROM, or Flash cells. High voltages are used in the reading and writing of the memory cells. Floating gate memory cells are typically imprinted (i.e., programmed and erased) using Fowler-Nordheim tunneling or source-side injection by hot electrons, or combinations of these.

In FIG. 1, the memory array is arranged in rows and columns of memory cells. Each row of memory cells has a word line (WL) and a bit line (BL). The word line is also sometimes referred to as a row line. Individual rows in the memory array are selected by using row decoders and an address. By using a unique address, a particular row decoder selects a particular row of memory cells in the array to read or write, or perform some other desired operation.

A row decoder is coupled to a word line of the array through a pass gate 120. In this specific embodiment, pass gate 120 is implemented using an NMOS transistor. Pass gates may also be formed using other devices and techniques. For example, a pass gate may be implemented using a CMOS transmission gate with a PMOS and NMOS transistor coupled in parallel. In the figure, an inverter 125 is used to represent the output driving buffer of a row decoder. This is a pass gate 120 for each word line in the array. For example, an array of memory cells may have 128 word lines. Then, there will be 128 pass gates 120.

Each word line is also coupled to a high voltage (HV) coupler circuit 130. The high voltage coupler circuit is used to couple a high voltage VPP to the word line. The HV coupler circuit be used to generate the high voltage to be coupled to the word line. Or, the high voltage may generated elsewhere on the integrated circuit, such as by a high voltage generator circuit; the HV coupler circuit may use and pass the high voltage from the high voltage generator.

The level of VPP may be above a level of a power supply VCC to the integrated circuit. For example if VCC is 5 volts, VPP may be 7 volts or above.

High voltages are coupled on the word line in order to perform operations such as writing the memory cells. For example, writing the memory cells may involve reprogramming a floating gate device, and high voltages on the word line are used to effect the Fowler-Nordheim or source-side (hot electron) injection mechanisms.

Memory cells are selectively operated on depending on whether a high voltage is placed on a selected word line. In particular, the row decoder selects whether the HV coupler circuit 130 places a high voltage on a particular word line. The control mechanism to select whether to place a VPP on a particular word line is threshold sensitive. Specifically, if the word line connected to the HV coupler circuit is at or above a selected VT(HV) voltage, then the HV coupler circuit place VPP on the word line.

For example, VT(HV) may be set at 4 volts. Then, if a row decoder drives a word line to 4 volts of greater, the HV coupler circuit for particular word line will place VPP on that word line. If a row decoder drive a word line to ground (or any other voltage below 4 volts), the HV coupler circuit will not place VPP on the word line.

A pass gate isolation circuit 140 is used to drive control electrodes of the pass gates 120 coupled between row decoders 110 and array 105. In particular, the pass gate isolation circuit performs the function of placing the appropriate voltages on the gates of the NMOS transistor 120 to enable coupling of the row decoders to the word lines of the array, or isolation of the row decoders from the word lines.

For example, in a specific embodiment, during a write mode, pass gate isolation circuit 140 couples a VW voltage to the control electrodes of the pass gates 120. The VW voltage should be at a level sufficient to permit a VT(HV) level voltage to pass from the row decoder through the pass gate to the word lines in the array. For example, the VW voltage may be VCC in the case when the VT(HV) voltage selected to be less than about VCC−VTN, where VTN is a threshold voltage of the NMOS pass transistor. For example, VT(HV) may be VCC/2. During the write mode, certain memory cells in array 105 may be imprinted with data.

Furthermore, the VW voltage should be at a sufficiently low level to isolate the high voltages on the word lines (provided by the HV coupler circuit) from the row decoders. If pass gates 120 do not isolate, the high voltages provided on the word lines will be drained to the VCC level through the output drivers of the row decoders.

Therefore, a VW voltage level of about VCC+VTN or less should be selected. This voltage level VCC+VTN is the high voltage level output at the output of the row decoders minus a threshold voltage of a NMOS transistor. This ensures that a high voltage on the word line is isolated from the row decoders.

For example, a VW voltage of VCC may be selected to satisfy this condition (and would also the condition concerning VT(HV) discussed above).

During a read mode, the pass gate isolation circuit 140 may couple a VCC+VCL voltage to the control electrode of the pass gate 120. The VCL voltage is an arbitrary positive voltage differential, and is selected by design and is limited by the physics of the process technology. For example, VCL may be 3*VTNs, where VTN is the threshold voltage of an NMOS transistor.

In brief, in the read mode, the pass gate isolation circuit places a voltage above VCC on the control electrodes of the pass gates. This permits the row decoder to drive more rapidly the word lines of the array. Moreover, it is desirable that the row decoder is able to drive full-rail supply voltages on the word line. To pass VCC from the row decoder through the pass gate to the word lines, this would require the VCL voltage to be selected to be about VCC+VTN or greater.

Figure 2:
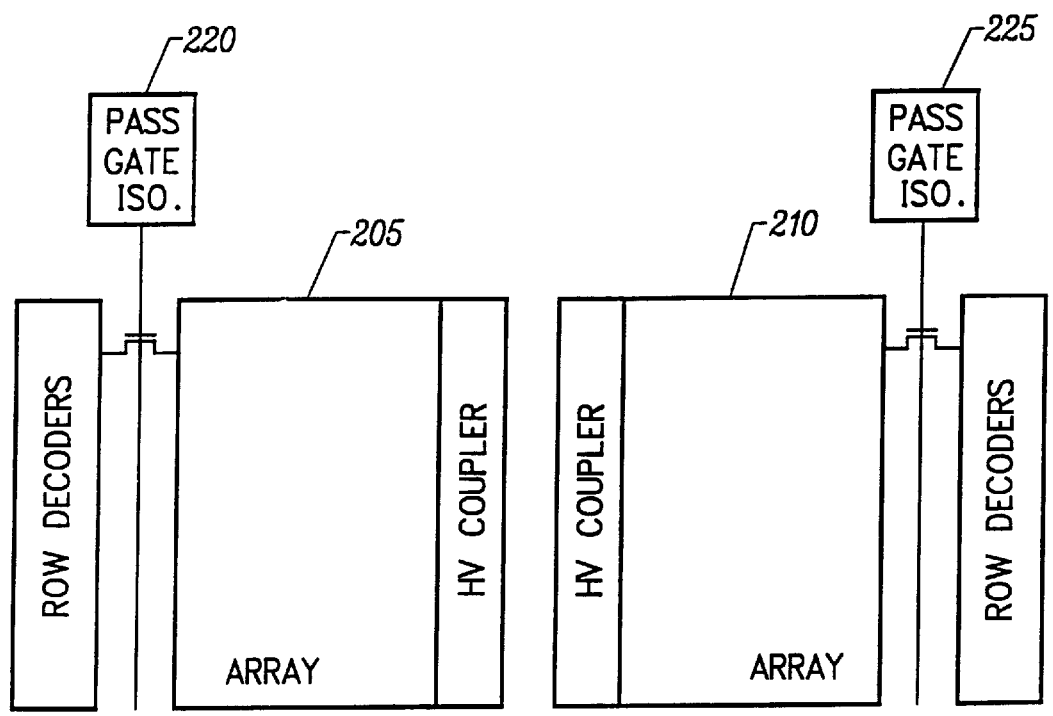
FIG. 2 shows a memory integrated circuit with multiple arrays.

FIG. 2 shows an integrated circuit where the array has been divided into multiple portions 205 and 210. In the design of high performance memories, it may be desirable to split up the memory cells to form a plurality of arrays of memory cells, with individual circuitry interfacing the separate arrays. Then, there may be two or more pass gate isolation circuits 220 and 225 on the integrated circuit. Both pass gate isolation circuits would perform a similar function for their respective memory array.

Figure 3:
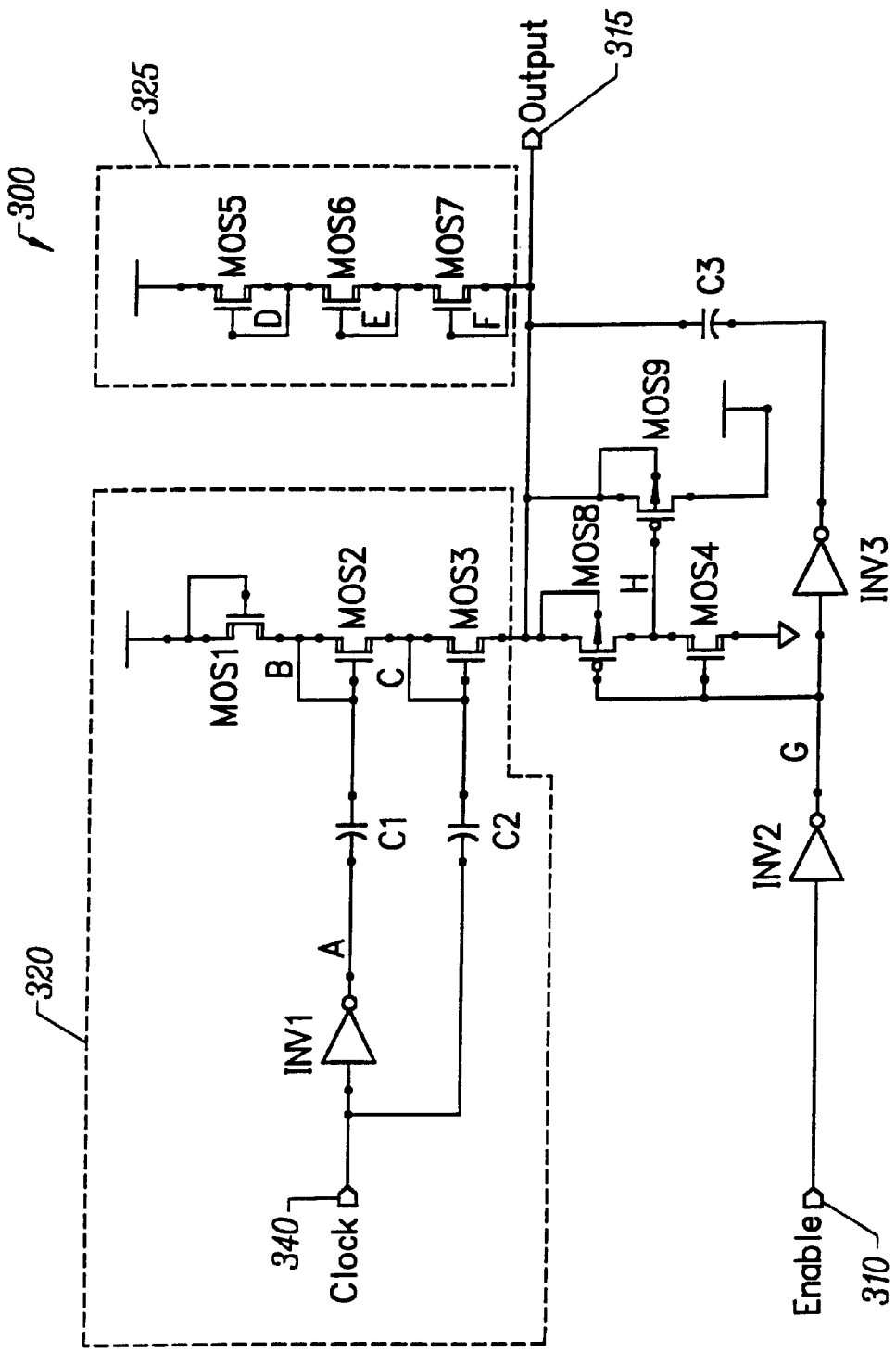
FIG. 3 shows a schematic a pass gate isolation circuit.

FIG. 3 shows a circuit diagram for a pass gate isolation circuit 300. Pass gate isolation circuit 300 may be used to implement the pass gate isolation circuits 140, 220, and 225 in FIGS. 1 and 2. The circuitry in FIG. 3 performs the functionality as describe above for the pass gate isolation circuitry.

The circuit has an ENABLE input 310 and an output 315. On the output line 315 there is a HV keeper circuit 320 and voltage clamp circuit 325. ENABLE 310 is coupled through an inverter INV2, an inverter INV3, and a capacitor C3 to output 315. Transistors MOS8 and MOS4 are coupled between output 315 and VSS. Gates of MOS8 and MOS4 are coupled to a node G, which is an output of INV2. In this specific embodiment, MOS8 is a PMOS transistor and has a substrate or n-well connection to output 315. MOS4 is an NMOS transistor.

A transistor MOS9 is coupled to between output 315 and VCC, and has a gate coupled to node H (where MOS8 and MOS4 are coupled together). MOS9 is a PMOS transistor and has a substrate or n-well connection to output 315.

In operation, when ENABLE 310 is a logic high (indicating a read mode), the output 315 will become VCC+VCL (in a steady state), as discussed above. When ENABLE 310 is a logic low (indicating a write mode), the output 31S will become VCC.

When ENABLE 310 transitions from a logic low to a logic high, output 315 is boosted via capacitor C3 from a VCC level to a VH voltage level above VCC. In a specific embodiment, a value of capacitance for C3 is about twice the output load at output 315. The voltage level of VH voltage level depends on the efficiency of the coupling capacitance provided by C3. The boosted voltage level VH may be up to about 2*VCC. This VH voltage level on placed on the pass gate 120, and speeds up the transfer of signals from the row decoder to the word lines of the array. This improves the performance of the integrated circuit.

Furthermore, when ENABLE 310 transitions from low to high, node G becomes low, turning off MOS4 and turning on MOS8. Then, a voltage from output 315 is permitted to pass through MOS8 to the gate of MOS9. This ensures MOS9 will be turned off.

Output 315 is dynamically coupled to a voltage above VCC during the low-to-high transition of ENABLE 310. Because this operation is dynamic, the voltage level at output 315 will slowly diminish (or dissipate) over time, possibly due to parasitic loss. HV keeper circuit 310 is used to maintain a high voltage level at output 315. HV keeper circuit 310 and voltage clamp circuit 325 work together to maintain a voltage level of VCC+VCL at output 315.

In FIG. 3, the HV keeper circuit is a voltage pump circuit. In this embodiment, the pump includes a diode-connected MOS transistor MOS1 coupled between VCC and a node B. Between node B and output 315 are diode-connected MOS transistors MOS2 and MOS3. A CLOCK input 340 is input to a gate of MOS3. CLOCK 340 is fed through an inverter INV3 to a gate of MOS2. MOS1, MOS2, and MOS3 are NMOS transistors in this embodiment. Other configurations of high voltage generation and keeper circuits may be used instead of the specific embodiment shown in FIG. 3.

By placing an oscillating signal at CLOCK 340, the voltage pump generates a high voltage at output 315. The voltage level at output 315 will be limited by voltage clamp circuit 325 to a level of about VCC+VCL. It is noted that the voltage pump consumes power when generating a high voltage.

The VCL is determined by the voltage clamp circuit 325. In the specific embodiment shown, voltage clamp circuit 325 has three transistors MOS5, MOS6, and MOS7 coupled between VCC and output 315. A gate of MOS5 is coupled to its drain, a gate of MOS6 is coupled to its drain, and a gate of MOS7 is coupled to output 315. MOS5, MOS6, and MOS7 are all NMOS transistors.

Voltage clamp circuit 325 limits a high voltage at output 315 to be a level of approximately VCC+3*VTN. Therefore, VCL in this specific case is 3*VTN. As can be seen, a VCL voltage level may be selected by varying the number of diode-connected transistors like MOS5, MOS6, and MOS7 coupled between output 316 and VCC. For example, if a VCL of about 5*VTN is desired, then five diode-connected transistors may be placed between output 315 and VCC. Other devices such as zener diodes or other circuits may be used at output 315 to clamp or limit the voltage level.

Ultimately, however, the maximum voltage at output 315 cannot exceed the breakdown voltage, and specifically, a gate-aided diode breakdown voltage, defined by the process technology. In other words, the voltage at output 315 would be limited by the breakdown of some device coupled to output 315 (which is coupled to, for example, transistor MOS3 in FIG. 1).

Therefore, after ENABLE 310 transitions from low to high, output 315 is dynamically coupled to a VH level. The level on output 315 gradually diminishes to a steady state voltage level of VCC+VCL determined by HV keeper circuit 320 and voltage clamp circuit 300. In this case, the VH level is above the steady state voltage level at output 315. However, in other embodiments, it is the steady state voltage level may be at or above the VH level.

When ENABLE 310 transition from high to low (i.e., for the write state), node G will transition to a logic high. This turns on MOS4 and turn off MOS8. The gate of MOS9 will be coupled to ground, and MOS9 will be turned on. Output 315 will be coupled to and held at VCC through MOS9. Any high voltages at output 315 will be discharged through MOS9 to the VCC supply.

It is also noted when output 315 is at VCC the voltage pump does not consume power, since no current flows from VCC through MOS1, MOS2, and MOS3. This reduces power consumption for the integrated circuit.

Figure 4:
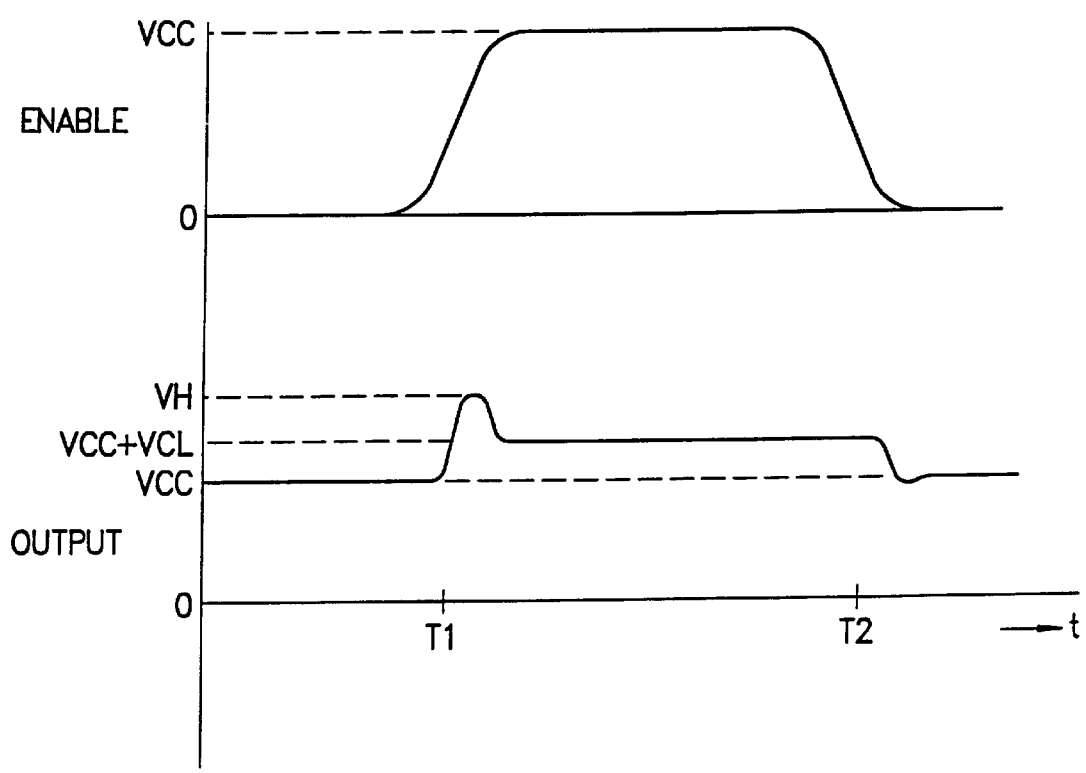
FIG. 4 shows a timing diagram of the pass gate isolation circuit of FIG. 3.

FIG. 4 shows a timing diagram for the operation of the circuitry in FIG. 3. Before time T1, the ENABLE signal (at ENABLE 310) is grounded, and the OUTPUT signal (at output 315) is at VCC. At time T1, the ENABLE signal transitions from low to high (indicating the read mode) The OUTPUT signal rises to VH and then settles at VCC+VCL. At time T2, the ENABLE signal transitions from high to low (indicating the write mode), the output signal returns to VCC.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize and practice the invention in various embodiments and with various modifications as are suited to the particular use contemplated. It is intended that the scope of the invention be defined by the following claims.

What is claimed is:

1. A method of operating an integrated circuit comprising:
   in a first mode, providing a first voltage level to an isolation device to isolate a high voltage on a word line from being drained by a row decoder coupled to the word line;
   in a second mode, dynamically coupling a second voltage level to the isolation device to permit transfer of a signal from the row decoder to the word line; and
   in the second mode, maintaining a third voltage level to the isolation device in a steady state.

2. The method of operating an integrated circuit of claim 1 wherein the second voltage level is above the third voltage level.

3. The method of operating an integrated circuit of claim 1 wherein the second and third voltage levels are above a supply voltage level of the integrated circuit.

4. The method of operating an integrated circuit of claim 1 wherein the first voltage level is about equal to a supply voltage level of the integrated circuit.

5. The method of operating an integrated circuit of claim 1 further comprising:

in the first mode, writing data to a memory cell associated with the word line.

6. The method of operating an integrated circuit of claim 1 further comprising:

in the second mode, reading data from a memory cell associated with the word line.

7. The method of operating an integrated circuit of claim 1 further comprising:

in the first mode, writing data to a memory cell using Fowler-Nordheim or source-side injection mechanisms.

8. The method of operating an integrated circuit of claim 1 wherein a plurality of nonvolatile memory cells are coupled to the word line.

9. The method of operating an integrated circuit of claim 1 wherein a plurality of Flash cells are coupled to the word line.

10. The method of operating an integrated circuit of claim 1 wherein the isolation device is an NMOS pass transistor.

11. A method of operating an integrated circuit comprising:

in a first mode, providing a first voltage level to a gate of an isolation transistor to isolate a first high voltage on a word line of a memory array from being drained by a row decoder coupled to the word line;

in a second mode, coupling a second voltage level to the gate of the isolation transistor to permit transfer of a signal from the row decoder to the word line; and in the second mode, maintaining a third voltage level at the gate of the isolation device in a steady state, wherein the second voltage level is above the third voltage level and the third voltage level is above the first voltage level.

12. The method of operating an integrated circuit of claim 11 wherein the first high voltage is above a positive supply voltage for the integrated circuit.

13. The method of operating an integrated circuit of claim 11 wherein the first high voltage is above the first voltage level.

14. The method of operating an integrated circuit of claim 11 wherein the first voltage level is above ground.

15. The method of operating an integrated circuit of claim 11 wherein the first voltage level is about a positive supply voltage level of the integrated circuit.

16. The method of operating an integrated circuit of claim 11 wherein the third level is about VCC+3*VTN.

17. The method of operating an integrated circuit of claim 11 wherein the first voltage level is about VCC.

18. The method of operating an integrated circuit of claim 11 wherein the second voltage level is about VCC+3*VTN.

19. The method of operating an integrated circuit of claim 11 wherein the second voltage level is in a range from about VCC to about 2*VCC.

20. A method of operating an integrated circuit comprising:

in a first mode, providing a voltage of about VCC to a gate of an isolation transistor, coupled between a row decoder and a word line with memory cells;

in a second mode, providing a dynamic voltage in a range from about VCC to about 2*VCC to the gate of the isolation device; and in the second mode, providing a steady state voltage of about VCC and VCL to the gate of the isolation device, wherein VCL is at least a VT of a transistor.

21. The method of operating an integrated circuit of claim 20 wherein VCL is at least 2*VT of a transistor.

22. The method of operating an integrated circuit of claim 20 wherein VCL is at least 3*VT of a transistor.

23. The method of operating an integrated circuit of claim 20 wherein VCL is at least 4*VT of a transistor.

24. The method of operating an integrated circuit of claim 20 wherein the isolation transistor is an NMOS device.

* * * * *